United States Patent [19]

Sandahl et al.

[11] Patent Number: 5,031,230
[45] Date of Patent: Jul. 9, 1991

[54] FREQUENCY, PHASE AND MODULATION CONTROL SYSTEM WHICH IS ESPECIALLY USEFUL IN SIMULCAST TRANSMISSION SYSTEMS

[75] Inventors: Joel Sandahl, Quincy, Ill.; Michael P. O'Brien; Thomas P. Donaher, both of Rochester, N.Y.

[73] Assignee: SimulComm Partnership, Quincy, Ill.

[21] Appl. No.: 261,530

[22] Filed: Oct. 24, 1988

[51] Int. Cl.$^5$ .............................. H04B 1/10
[52] U.S. Cl. ..................... 455/50; 455/103; 455/51; 375/107
[58] Field of Search ............ 455/50, 51, 63, 24, 455/53, 67, 102, 103, 119, 118, 101, 116, 182, 183; 328/134, 155; 375/107, 109; 331/17; 324/79

[56] References Cited

U.S. PATENT DOCUMENTS

| | | | |
|---|---|---|---|
| 4,023,116 | 5/1977 | Alfke et al. | 331/17 |
| 4,188,582 | 2/1980 | Cannalte et al. | 455/51 |
| 4,305,045 | 12/1981 | Metz et al. | 331/17 |
| 4,316,152 | 2/1982 | Meyer | 331/1 A |
| 4,715,001 | 12/1987 | Deem et al. | 455/182 |
| 4,718,109 | 1/1988 | Breeden et al. | 455/56 |
| 4,731,880 | 3/1988 | Ault et al. | 455/69 |

FOREIGN PATENT DOCUMENTS 0079280 11/1982 European Pat. Off. .
0237699 1/1987 European Pat. Off. .

Primary Examiner—Reinhard J. Eisenzopf
Assistant Examiner—Edward Urban
Attorney, Agent, or Firm—Martin Lukacher

[57] ABSTRACT

A system enabling the frequency, and if desired, phase control of an oscillator which generates a standard signal useful as a carrier which is modulated by modulation signals. A multiplicity of such oscillators and associated transmitters may be used in a simulcast transmission system. The transmissions originate from a station which may be remote from the transmitters. The station has a system controller and the transmitters have transmitter controllers. For frequency control a reference signal generated in the system controller is transmitted over the same link and band width (e.g. the voice band width) with the voice modulating signals to the transmitter controllers of all of the transmitters. At the transmitter controllers, multiplicities of phase measurements are made from which statistical values of phase, deviations and times of occurrence are collected and used to provide error control signals in terms of the ratio of phase difference to time, notwithstanding that the reference signals may jitter in phase and amplitude due to noise and other errors and also notwithstanding that the phase measured at various of the times may include a multiplicity of phase wraps (the phase difference being greater than one cycle or 360°.) The frequency errors may be applied to the standard oscillator to lock the phase thereof in predetermined relationship with the reference. For modulation control codes representing deviations from matched correlation characteristics (delay, gain and frequency spectrum) are transmitted to each transmitter where modulation signal correction circuits are conditioned to process the modulating signals so that the transmissions from each transmitter will be matched in modulation characteristics.

36 Claims, 10 Drawing Sheets

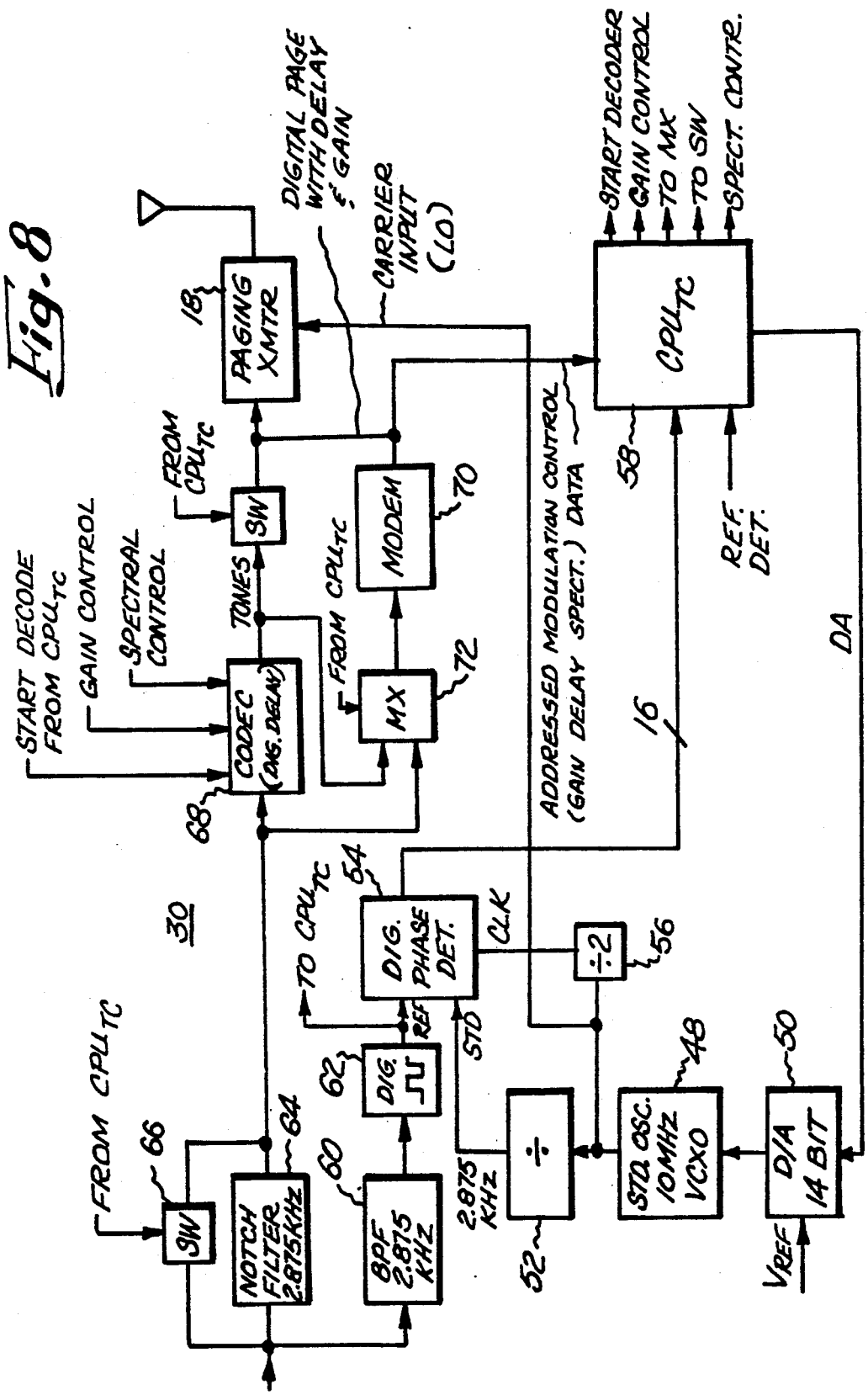

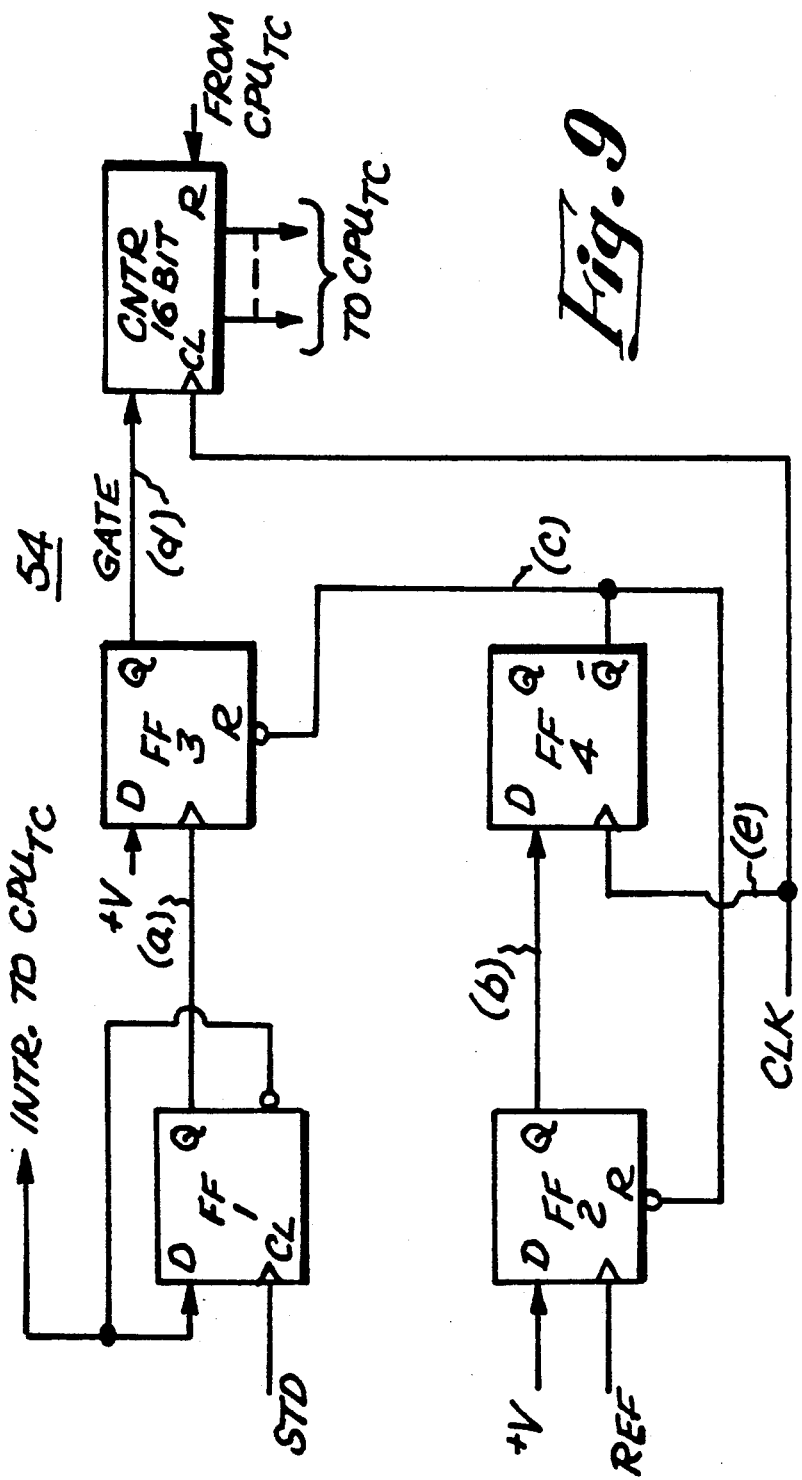

FREQUENCY, PHASE AND MODULATION CONTROL SYSTEM WHICH IS ESPECIALLY USEFUL IN SIMULCAST TRANSMISSION SYSTEMS

DESCRIPTION

Introduction

The present invention relates to a system (method and apparatus) for controlling the frequency and phase of an oscillator which may be used to generate a carrier which can be modulated for communication purposes; the system also being adapted to control the modulation.

The system is especially suitable for use in simulcast systems for monitoring and automatic control of the carrier frequency of simulcast transmitters and also for modulation matching of the transmitters (simulcast adjustment) whereby to reduce signal degradation due to interference in zones where transmissions from different transmitters overlap. The system is generally useful in applications which require precise time and/or frequency standards. Thus the system may be used in providing a time or frequency standard referenced to an accepted absolute standard such as a governmental transmission from WWVB in the United States or MSF in England, or to relative reference signals based on standards contained within an application system such as reference frequency oscillators, sometimes called disciplined oscillator systems (see, e.g., U.S. Pat. No. 4,528,685 issued June 25, 1985 to Robert J. Hesselberth, Thomas P. Donaher and Joel E. Sandahl).

BACKGROUND

Frequency and phase controllers, such as disciplined oscillators as described in the above-referenced U.S. patent and also the Stratum 2 disciplined oscillator sold by Spectracom Corporation, East Rochester, New York 14445 U.S., have used digital techniques for locking a standard oscillator to a reference and even removing long term phase and frequency variations to high degrees of precision. In such systems the reference frequency source is reliable (essentially uncorrupted by noise and other errors) for long periods of time, or the reference frequency source is located close by the controlled standard source and provides continuous, essentially noise and error free reference signals. The reference signals are also available at high frequencies, for example 10 Mhz so that frequency and phase errors are detected quickly while the reference is monitored.

In such applications as simulcast transmission systems where precise frequency control is required so as to prevent interference in zones where transmissions from different transmitters overlap, and in other applications where frequency and/or phase control of the local standard signal source is required, a local reference signal is not available. It is desirable that the signal be transmitted to sites remote from the reference source. This, however, adds noise and other errors which cause the phase of the reference to jitter and the reference to vary in amplitude. Also, there may not be a separate link for reference signals over which the reference frequency can be transmitted at high frequency. It is desirable to place the reference frequency within the band width of the other signals which are being communicated for transmission. In simulcast transmission these signals occupy the voice band width (300 to 3,000 Hz). The problem is exacerbated in simulcast transmission since customer traffic (pages in paging simulcast systems) must be given preference to calibration of the transmitters to the precise carrier frequencies required for proper system performance. Thus, it is desirable that the frequency calibration be carried out using information which is available only intermittently, perhaps at times separated by hours, and yet maintain the requisite precise frequency control of all of the transmitters.

In simulcast transmission systems frequency control is conventionally accomplished by technicians who must visit the remote transmitter sites and align the transmitters in frequency. Alignment of the transmitter's modulation characteristics (delay, gain, manually at the transmitter sites. If the modulation characteristics of the transmitters are not aligned, interference arises particularly in zones where the transmissions overlap. It is desirable that such alignment be carried out automatically, on a regular schedule or at times when the traffic carried by the system is light.

SUMMARY OF THE INVENTION

It is the principal object of this invention to provide an improved system (method and apparatus) for calibrating a standard signal source is frequency and/or phase to a supplied reference signal which has the following characteristics: the reference and standard may be local or remote from each other and from the system which provides the calibrating adjustments; the reference and/or the standard signals may have dynamically varying components of noise and other error signals added to them; the reference signal may be transmitted over a low frequency (e.g. voice band width) link thereby enabling the link to be shared with other signals such as control tones for other alignment (e.g. in modulation characteristics) purposes; the quality of the reference signal (e.g. the spectral density of the noise and error signals) from the interconnecting link can be measured by the same process as provides for the calibration of the standard signal source; the reference and/or standard signals may be intermittently supplied even over extended periods of time; the rapidity at which the calibration and adjustment of the standard is carried out is variable; even long term variations in frequency and/or phase (second order standard signal errors due to aging of components of the standard frequency source, such as the quartz crystal of a variable frequency quartz crystal controlled oscillator used as the standard source) are accounted for in the adjustment; the precision of frequency and/or phase control (e.g. to parts per million or better) may be increased to high levels if desired; the standard may have a selected frequency offset with respect to the reference and remain locked in frequency to the reference with the offset.

Briefly described, a system for providing a signal controlled in frequency, in accordance with the invention, uses means for providing a source of reference signals and means for providing a source of a standard signal which is responsive to a frequency error signal. Means are provided for making measurements of the relative phase difference between the reference and standard signals at a plurality of times spaced in duration from each other. Means are also provided for translating the ratio of the difference in the phase measurements to the duration into the frequency error signal. This frequency error signal is then applied to the standard so as to precisely control the frequency thereof.

It is a further object aspect of the invention to provide, in communication systems where signals are transmitted simultaneously by a plurality of transmitters (i.e. simulcast transmission systems), improvements which enable matching of the transmitted signals in their modulation characteristics (e.g. delay, gain, and spectrum) thereby aligning the transmitters and avoiding interference and distortion in zones where transmissions overlap.

Briefly described, a communications system (simulcast transmission system) embodying the modulation characteristic matching aspect of the invention, utilizes means for transmitting alignment signals (control tones) or other alignment signals to transmitter controllers for each transmitter in the system. The transmitter controllers include circuits in the modulating signal paths to the transmitters for controlling the characteristics of the modulating signals (inserted delay, gain, and spectrum). During alignment the control signals are generated in a system controller at the control station or terminal of the system. A receiver receives the transmissions from the transmitters. The system controller multiplexes the transmission and reception of the control and alignment signals and correlates them to derive digital control signals which are addressed to each of the transmitters. These digital signals contain data for controlling the modulation characteristic control circuits such that the modulation characteristics of all transmitters become automatically matched and aligned.

Principles of the Invention

The principles of the invention will be better understood with reference to FIGS. 1 through 6 of the drawings which show curves explanatory thereof. FIG. 1 is a graph of phase measurements of the phase difference over time for a given frequency difference between the reference and standard signals. These phase measurements, may and in a system containing a preferred embodiment of the invention are, generated by a digital counter gated by a signal representing the phase difference between the reference and standard signals. Considering that the reference signal is used to start the phase difference gate signal, positive slopes indicate that the standard is lower in frequency than the reference. Conversely, a negative slope indicates that the standard is higher in frequency than the reference. The magnitude of the slope is a direct expression of the scalar quantity, frequency error. The graph in FIG. 1 is idealized in that the measurements are not perturbed by noise. In practical applications, as discussed above, it is desirable for the reference and/or standard source to be remotely located and interconnected via some medium (link) which can introduce significant components of noise. FIG. 2 graphs typical phase measurements over time where noise is present. While the actual frequency error between the reference and standard signals has not changed, the "measured" frequency error becomes dependent on the actual moment that initial and final phase measurements are taken. This principle is shown in greater detail in FIG. 3.

In FIG. 3 the solid straight line is the actual frequency error. The curved, wiggly line shows the actual phase measurements perturbed by noise. The dash line indicates the computed frequency error based on the initial and final phase measurements over a hundred second period which is presented by way of illustration. The ordinate of the graph in FIG. 3 represents the phase measurement in terms of counts and assumes a phase measurement clock of 1 Mhz thereby making the maximum phase measurement for one cycle or wrap (360° of phase difference) equal to 999. In this idealized representation there is a given frequency error and the phase detector is operative at 1,000 Hz (1,000 microseconds (us)per period.) The computed or measured frequency error and the actual frequency error differ by more than two to one. Inasmuch as noise (errors) are linearly additive, the error of the measured frequency error approaches zero error as the measurement interval approaches infinity. For example, in FIG. 3 increasing the period to two hundred seconds could decrease the measurement error to ten percent. However, infinity is a very long time to wait to determine the frequency error and it is impractical to use an extremely long measurement interval to calibrate the standard source. Using prolonged measurement intervals is also impractical since the noise power (the source of the error) is not known and may be varying throughout the interval that the measurement is made.

In accordance with the invention these problems are overcome by rapidly collecting a series (multiplicity of successive) of measurements and reducing these measurements to a single qualified value as though it were a single measurement. The principles are illustrated in FIG. 4 which is similar to FIG. 3 but has a much more compressed time scale. The variability of the measurements is influenced by the rate of the measurements and the interval over which they are taken. The upper frequency limit of the variability is established by the band width of the reference signal and also of the standard signal. The band width of the standard signal may be neglected if the standard oscillator is not remote from the control system which determines the frequency error so that the standard signal is not filtered. This is the case in the preferred embodiment of the invention described hereinafter. The reference signal is filtered. The upper frequency limit of the variability is then established by the band width of the band pass filter. The lower frequency limit goes to zero as the noise density on the reference signal approaches one at the phase detection frequency over the interval during which the phase measurements are taken. This is an unlikely event since the noise then would be at a single frequency. The lower frequency limit is, alternatively, the frequency where the total noise power goes to zero (noninterfering). The magnitude of the variability approaches the maximum phase measurement (the maximum count of the counter gated by the phase difference signal) as the signal to noise ratio of the reference signal goes to zero or the noise density goes to one at the phase detector frequency over the measurement interval. In other words, the band width of the band pass filters determines the rate of change in the noise that can influence the measurement thus, if the band width were infinitely narrow the measurement might change in amplitude but never in phase. A wider band width's noise components are transmitted, which in effect jitters the phase difference signal.

In FIG. 3 a sampling rate of every other cycle of the reference signal at the phase detector is assumed, therefore fifty cycles of the reference signal are sampled in 0.1 seconds. It will become apparent that in the preferred embodiment the reference signal frequency is 2875 Hz and sampling is done on alternate cycles or approximately every 700 microseconds (i.e. at a 1400 sample per second rate). This represents an over-sampling condition since the band width of the filters in the preferred embodiment is approximately 140 Hz. It is necessary to sample at a rate at least twice the band width (the Nyquist value) for minimum aliasing error. It is preferred to sample at a rate at least three times the band width. Then, the sample rate is at least three times the upper frequency limit of variability.

The interval of sampling should span a period equal to the lowest practical frequency component of variability based upon the noise environment (the noise component of the reference signal through the band pass filter). While the sampling rate is established at a high enough rate to assure the capturing of the magnitude of the variability of the measurements, the sampling interval is selected to place an upper bound on the error of the mean of the variability of the measurements. The measurements may be considered a sample set. Thus, in a practical system using a 2875 Hz reference, sampling over an interval of from 50 to 100 ms picks up the lowest frequency component of noise (jitter) reasonably expected to exist in the reference signal.

The exact interval may be determined experimentally by looking at the mean of the measurements as the intervals increase. When the variability of the mean becomes stable over an interval of measurement, a sampling period of that interval should be sufficient.

Referring to FIG. 4, if the interval were half as long as indicated the mean (average of all samples) would be much higher than shown for the 100 millisecond measurement interval indicated in FIG. 4. Thus, where the mean stops varying as the sampling period increases may be used as the criteria for selecting the sampling interval. Thus, the sampling interval is selected to place an upper bound on the error of the mean for the sample set.

For each collected sample set, which is collected at a particular time over a sampling interval, the mean and standard deviation and the time when the samples were taken is derived. The values of the mean and standard deviation are used to represent the data samples as a single phase measurement (datum). The mean is used as the effective phase measurement. The standard deviation is used as an expression of the relative uncertainty (potential error) in the mean. This error can be understood by examining FIGS. 5A and 5B.

FIG. 5A shows a case, idealized for purposes of explanation, where the variation in measured phase is sinusoidal. The mean error, as shown in FIG. 5B, results from the averaging of samples over intervals where the integral of noise is non-zero. FIGS. 5A and B show that the greater number of noise cycles, the lower the possible mean error. This illustrates the significance of the lower frequency limit of noise. For Gaussian noise sources, it is known that there is a very small probability (less than 0.3%) that any sample in the set differs from the mean by more than three standard deviations. Therefore, in the worst case, the samples of significance are spaced within six standard deviations about the mean. If the interval bounds the lower frequency components of variability, the mean error is likely to be less than 1.5 standard deviations (V/2 in FIG. 5B).

It is possible that the phase measurements taken at an initial time and a later time which are used to compute the frequency error (delta f over delta t or the slope of the relative phase versus time curve as shown in FIG. 1) are separated in time by more than a cycle of the frequency difference or 360° of phase. This is referred to as a "wrap". Thus, the measurement with one or more wraps may indicate minimum frequency error while the standard and reference signals may differ in frequency by several cycles. The effect of wrap is illustrated in FIG. 6 where $S_0$ is the time of the initial measurement and $S_1$, $S_2$ and $S_3$ are measurements made later in time. These may be made at regular time intervals, as shown, or at varying time intervals as is likely to be the case to accommodate priority to traffic in a communication system, such as a simulcast paging system. The actual measurements at $S_1$, $S_2$ and $S_3$ are labeled "a". It may be that the phase difference wrapped one or more times between the time of $S_0$ and the other measurements. The likelihood of a wrap is higher the further distant in time the measurement is. In the illustrated case, $S_2$ and $S_3$ have wrapped. $S_3$ wrapped twice, while $S_2$ wrapped once. The principle which takes into account wrapping is that if wrap is taken into account, then all of the measurements will be correlated. They can be considered to be correlated if they are within a certain multiple of their variability (e.g., standard deviation) from the phase along slopes defined by the initial and last measurement ($S_0$ and $S_3$ in the case illustrated in FIG. 6). In order to accommodate a reasonable amount of jitter as discussed above the limit of the variability is obtained using a multiplier of 1.5 or 1.5 standard deviations.

In the case illustrated in FIG. 6, it is apparent that the initial measurements provide slope b-1. The $S_1$ and $S_2$ points are beyond 1.5 standard deviations from the phase at $S_1$ and $S_2$ on the slope b-1. A wrap of one cycle of the latest measurement ($S_3$) is assumed and the phase of $S_3$ is adjusted by one wrap. A new slope b-2 is then assumed. For this slope, $S_1$ and $S_2$ are to the left (earlier in time) than the time of the wrap, which is the time where the slope b-2 intersects the one-wrap level. Accordingly, the measurements at $S_1$ and $S_2$ did not wrap. However, $S_1$ and $S_2$ are further than 1.5 standard deviations from the slope b-2. Accordingly another wrap of $S_3$ and a new slope b-3 is assumed. This slope is with another wrap added to the $S_3$ measurement. Now the $S_2$ measurement is to the right (later in time) than the intersection with the one-wrap level. It must then be that $S_2$ also wrapped and wrapped one cycle. $S_2$ is then adjusted. It will now be apparent that all of the measurements, as adjusted, correlate and are within 1.5 standard deviations of the slope. The frequency error is then the slope of line b-3.

In a practical system, as will be discussed in detail hereinafter, the number of wraps which can be accommodated will be related to the maximum frequency deviation or control range of the standard oscillator. If that range is plus or minus 10 cycles, up to plus or minus 10 wraps for the last measurement can be checked for correlation. If no correlation exists, then another measurement is taken. Assuming that only four measurements are used, one of the measurements which is closest in time to its preceding measurement (the shortest time or $S_1$ minus $S_0$, $S_2$ minus $S_1$, or $S_3$ minus $S_2$) determines whether $S_1$, $S_2$ or $S_3$ is removed. Then another measurement is taken and is used as the last measurement for determining the slope and frequency error. The measurements are then correlated for wraps. If no correlation is achieved in spite of a predetermined number of tests, an alarm indication will be provided to the system operator. Accordingly, the principles of operation of the system enable the use of measurements which are perturbed by noise and other errors or the measurements will not be made continuously but can be made intermittently and at different times.

The invention itself, as well as the foregoing and other objects and advantages thereof, will be apparent from FIGS. 1 through 6 and from FIGS. 7 through 12. FIGS. 1 through 6 were discussed above and these FIGS., as well as FIGS. 7 through 12, are described briefly as follows.

DESCRIPTION OF THE FIGS. OF THE DRAWING

Figure 1:
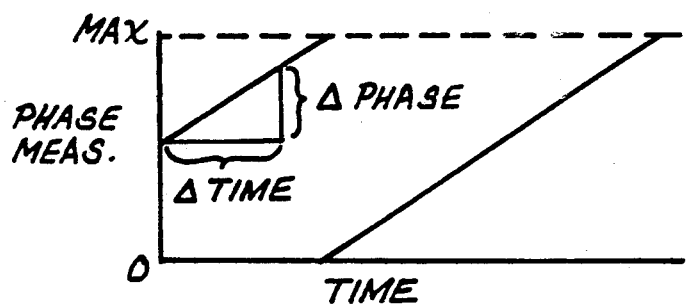
FIG. 1 is a graph showing relative phase versus time for a given frequency difference between a reference and a standard signal under noiseless conditions.
Figure 2:
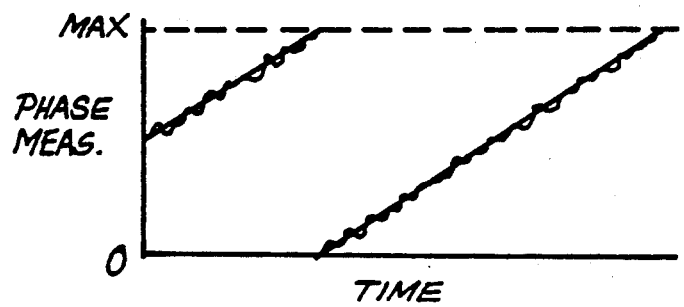
FIG. 2 is a graph similar to FIG. 1 where noise is present.
Figure 3:
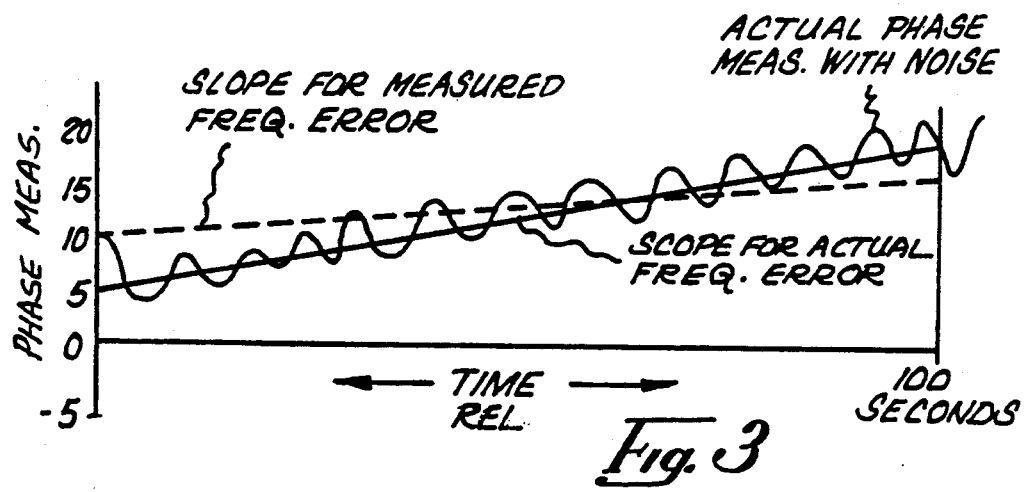
FIG. 3 is a graph showing relative phase verses time for given frequency error where noise is present and which illustrates how noise perturbs the frequency error measurement.
Figure 4:
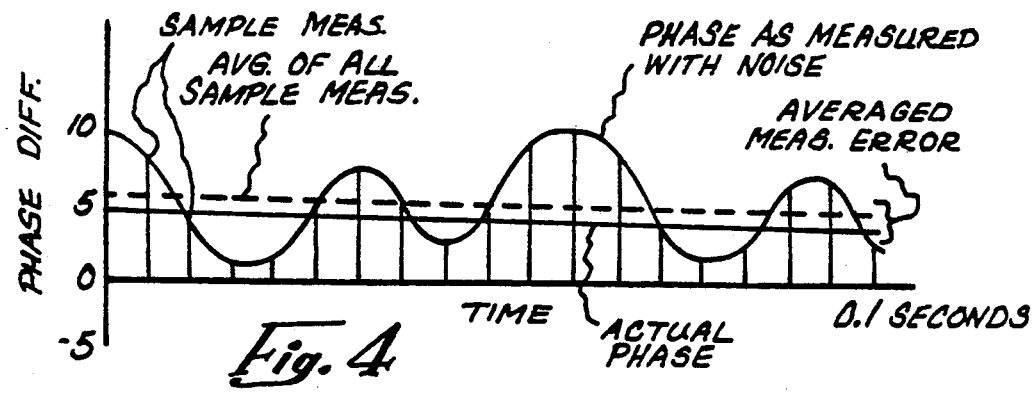
FIG. 4 is a graph similar to FIG. 3 but on an expanded scale.
Figure 5A:
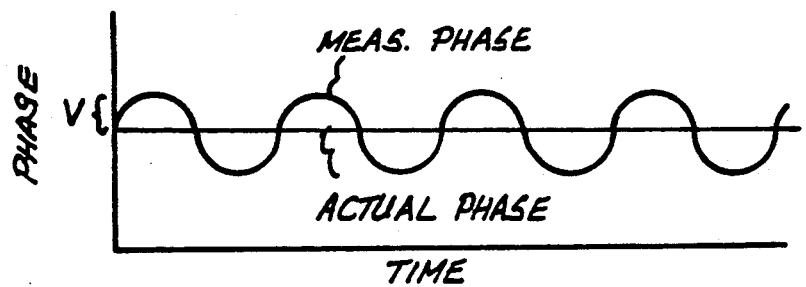
FIGS. 5A and 5B are graphs idealized to show variations in phase and in mean phase difference or error over a plurality of cycles of phase difference so as to show the effect of varying the measurement interval during high samples of phase are taken.
Figure 5B:
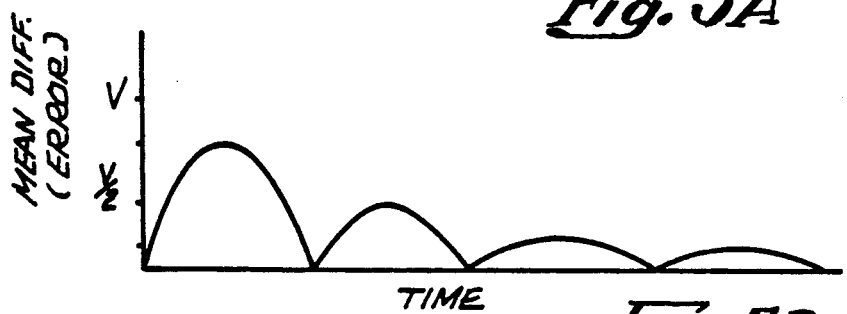
Figure 6:
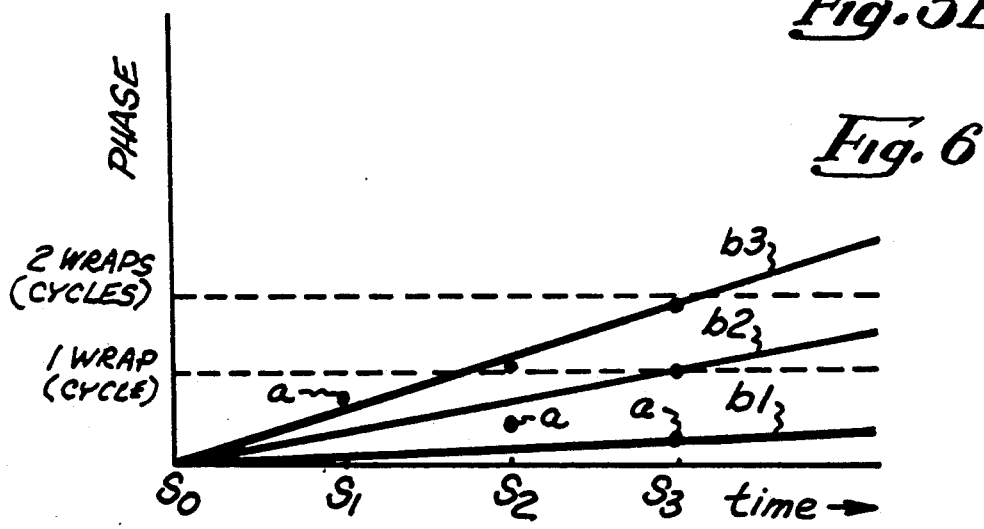
FIG. 6 is a graph illustrating the effect of phase wraps on the phase, measurements and showing the adjustment thereof by correlation with the slopes of lines without wrap with one and two cycles of wrap.
Figure 9A:
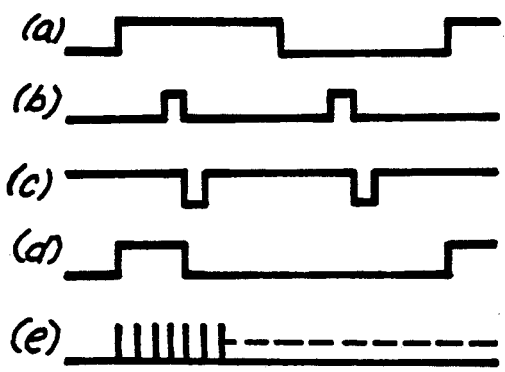
Figure 7A:
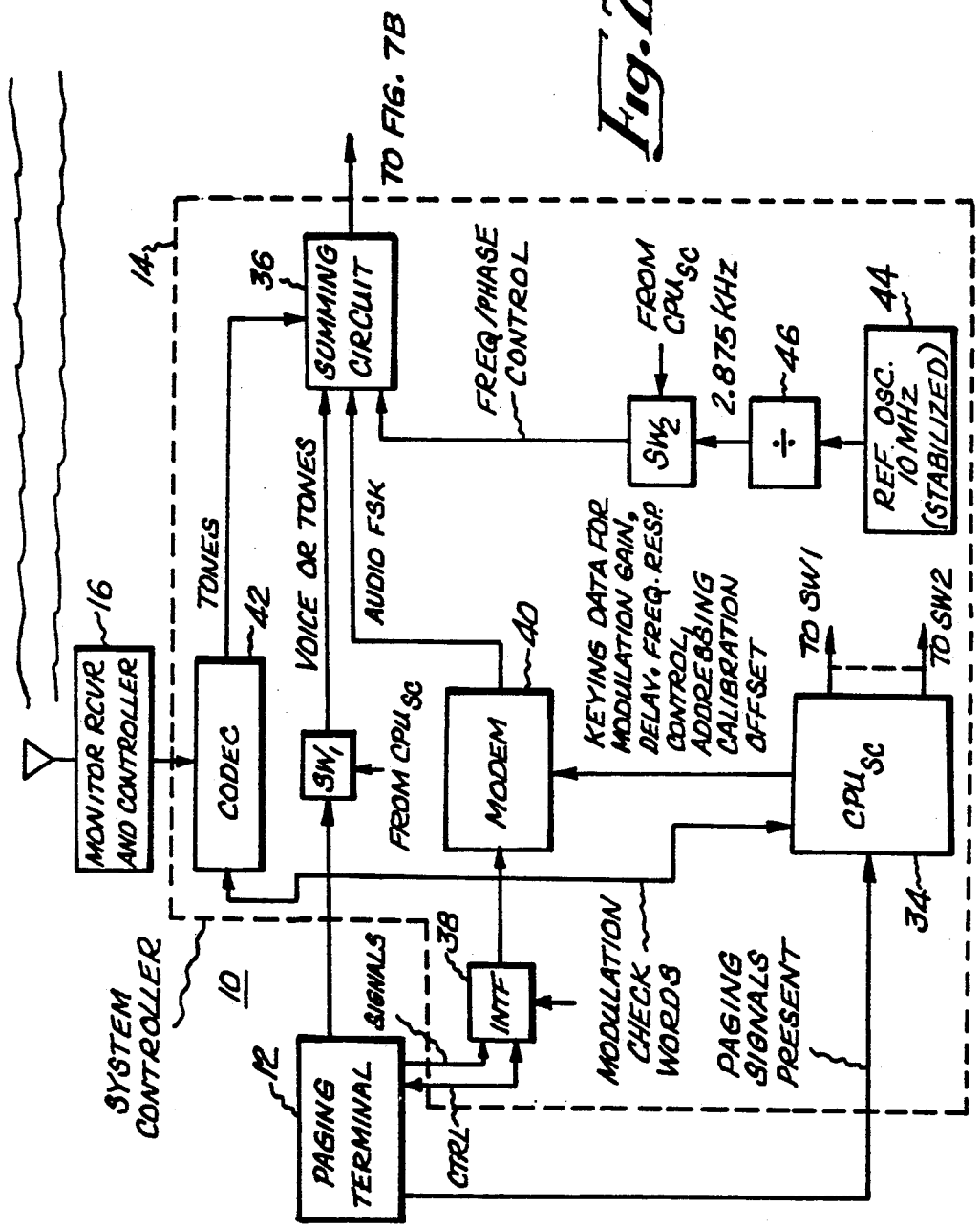
Figure 7B:
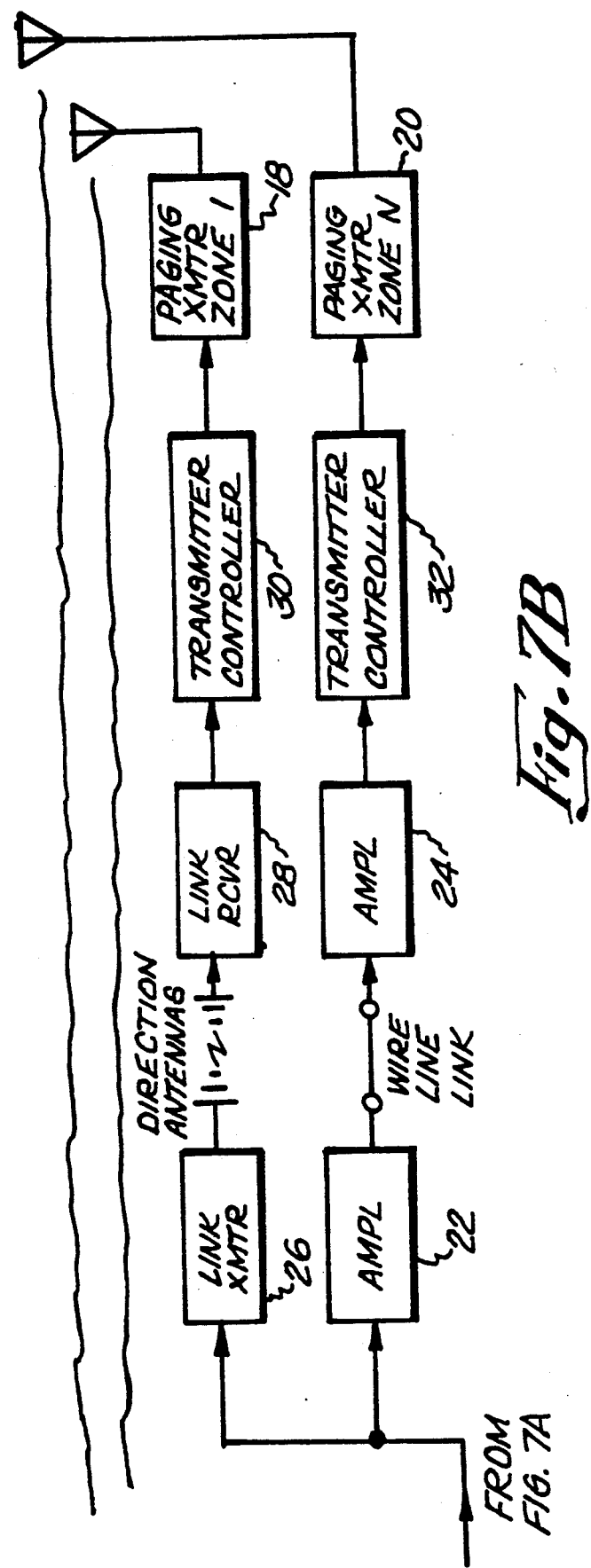

FIGS. 7A and B is a block diagram illustrating a simulcast paging system embodying the invention;

FIG. 8 is a block diagram illustrating the transmitter controller of the system shown in FIG. 1;

FIG. 9 is a block diagram illustrating the digital phase detector shown in FIG. 8;

FIG. 9A is a timing diagram illustrating the operation of the phase detector shown in FIG. 9; and FIGS. 10, 11A and 11B, and 12 are flowcharts illustrating the structure and format of the program of the central processing unit in the transmitter controllers of the system shown in FIGS. 7 and 8.

DESCRIPTION OF PREFERRED EMBODIMENT

Referring to FIG. 7, there is shown a simulcast paging system. The system has a control station or terminal 10. A paging terminal 12 is located at the control station together with a system controller 14 and a monitor receiver and controller 16. The station outputs a modulating signal over a voice band width (300 to 3,000 Hz) from the system controller. The signals transmitted may be voice or tones generated in the paging terminal 12. The signal also may be a digital signal which is transmitted by a frequency shift key transmission which is referred to as audio FSK.

The simulcast system may have a large number of transmitters each of which covers a different zone. A paging transmitter 18 for zone 1 and another paging transmitter 20 for zone N are shown. There may be hundreds of such transmitters each covering a different area or zone which overlaps so as to avoid any areas which do not receive signals from the control station 10. There also may be paging transmitters in the immediate vicinity of the control station 10. These close by transmitters can be connected by cables (not shown) to the system controller 14. More distant transmitters are connected over wire line links or by radio links such as via directional antennas. These wire line and radio links are conventional, and in the case of the wire line links, are shown as having amplifiers 22 and 24 at the opposite ends of the link. The radio links have a link transmitter 26 at the down-link end and a link receiver 28 at the up-link end. The signals over the links are used to modulate the paging transmitters. The signals are processed in transmitter controllers 30 and 32. One controller is provided for each paging transmitter. It provides the actual modulating signals to the paging transmitters. Modulation may be FM modulation as is conventional in paging systems. Other types of modulation can be used.

The system controller 14 has a microprocessor central processing unit 34 ($CPU_{sc}$). The $CPU_{sc}$ is responsive to a command from the paging terminal 12 indicating that the paging signals are present. It controls a switch, SW1, to connect the paging terminal to a summing circuit 36 for the transmission of voice signals or paging tones. The paging terminal may also generate digital signals which are connected through an interface 38 which may operate in accordance with a standard protocol to apply the digital signals in format for use by the paging receivers supplied to customers. This digital data is applied to a modem 40 when the interface is enabled by the $CPU_{sc}$. The modem 40 transmits the digital data as the audio FSK signals and applies them to the summing circuit 36.

The $CPU_{sc}$ also generates modulation check words which are applied to a CODEC (coder decoder) 42. This CODEC may be a commercially available chip and converts the modulation check word data into tones. The tones are also applied to the summing circuit 36. The $CPU_{sc}$ also generates keying data for modulation characteristic matching and alignment (i.e. gain, delay and frequency response control) or controlling various transmitters to transmit at a carrier frequency at or offset a predetermined number of cycles (Hz) from the standard carrier frequency. This keying data is addressed with address bits to different transmitters, and particularly to operate the transmitter controllers thereof. This keying data is applied to the modem 40 and transmitted as audio FSK digital data via the summing circuit to all of the paging transmitters.

The system controller 14 also has a reference signal generating source. This source may be a reference oscillator. A 10 MHz stabilized crystal oscillator (with a quartz crystal in an oven) may be used. The reference oscillator may also be a disciplined oscillator such as described in the above-referenced patent, or it may be a Stratum-type disciplined oscillator available from Spectracom Corporation. The reference oscillator 44 provides the reference frequency at 10 MHz which is divided after digitization in a digital divider or counterchain 46. When the $CPU_{sc}$ closes a switch SW2, the control tone in the voice band is applied to the summing circuit 36. The control tone (the reference REF) is desirably at the high end of the band. The 2.875 KHz tone is suitable. It is transmitted with the other signals to the paging transmitters. The presence of the 2.875 KHz tone may be a signal to enable all of the transmitters to transmit, putting the simulcast system in broadcast or "on the air" mode. The absence of the 2.875 KHz tone would then be an inhibit on the transmitter. Thus, the reference may serve two purposes. However, it may be desirable to use another signal for transmitter enable and inhibit purposes. Then the 2.875 is turned on only at times of calibration of the standard frequency source 48 in the transmitter controllers.

The transmitter controllers are shown in FIG. 8. They include a standard oscillator, which in the illustrated system is a 10 MHz voltage controlled crystal oscillator (VCXO). The control voltage for correcting frequency errors is obtained from a digital to analog converter (D/A) 50 which is suitably a 14 bit D/A. The standard oscillator output is digitized into pulses and divided in a divider 52 to produce the 2.875 KHz standard signal for comparison with the reference is a digital phase detector 54. The digital phase detector is also clocked by the standard oscillator signal divided by 2 in a divider 56. The clock is therefore at approximately a 700 microsecond rate. The digital output from the phase detector 54 is then coherent (synchronized) with the standard oscillator frequency. The standard oscillator frequency is also used as the carrier input (local oscillator or LO input) to the paging transmitter 18 which is associated with the transmitter controller 30.

A microprocessor provides a central processing unit 58 in the transmitter controller and is referred to as the $CPU_{tc}$.

The reference signal is separated by a band pass filter 60. As mentioned in the foregoing discussion of the principles of the invention, the band width of this filter may be approximately 140 Hz. The output of the filter is digitized in a digitizer 62 which may be a squaring circuit. When the reference is present, the digitized output is present. This output may be detected by the $CPU_{tc}$ which will be inhibited from making a calibration measurement in the absence of the reference.

The reference is excluded from the path carrying the voice, tones or audio FSK digital signals (keying data or control tones from the CODEC 42 in the system controller 14) by notch filter 64 tuned to reject the 2.875 KHz reference. Under some circumstances, such as an alignment of spectral characteristics, it may be desirable to bypass the notch filter. Then, a switch (SW) 66 is closed in response to a command from the $CPU_{tc}$. Modulation check words (as control tones from the CODEC 42) are transmitted through a CODEC 68 which converts the tones and voice frequency signals into PCM (pulse code modulated) signals which are then decoded back into tones and applied to the paging transmitter. The modulation characteristics are adjusted in the CODEC 68.

The CODEC 68 has a start decode control, a gain control and a spectral control. The start decode is a digital command from the $CPU_{tc}$ which provides a digital delay between the tones at the input of the CODEC 68 and the tones of the output thereof. The gain control is by way of the digital word from the $CPU_{tc}$ which controls the PCM samples to adjust their amplitude, again for alignment or matching purposes. The spectral control is a word to a digital filter in the CODEC which controls the spectrum of the tones. Data for these digital words is generated in the $CPU_{sc}$ of the system controller 14. These digital words are transmitted via the modem 40 as audio FSK digital data addressed to the various transmitter controllers. The digital words are switched to a modem 70 in the transmitter controller 30 via a multiplexer switch 72 (MX). They are converted into addressed digital modulation control data. This data is accumulated in the $CPU_{tc}$ and applied to the CODEC 68 to align the modulation characteristics of the transmitted paging signals from the paging transmitter 18 with the modulation characteristics of the other N paging transmitters in the system.

In order to obtain this modulation control data, the modulation check words which are generated by the $CPU_{sc}$ 34 (FIG. 7A) are used. These modulation check words, translated into tones by the CODEC 42, are transmitted through the CODEC 68 as modulating signals to the paging transmitter 18. The modulating signals are returned to the monitor receiver 16. If desired, address signals may accompany the modulation check word tones so as to designate the particular paging transmitter which is then transmitting. The check tones are then digitized in the CODEC 42 of the system controller 14 and stored in a table in the memory of the $CPU_{sc}$. There they are correlated and necessary keying data for gain, delay and frequency response control addressed to particular paging transmitters is generated and transmitted via the audio FSK channel.

At the transmitter controller, the keying data is translated back into digital signals in the modem 70 and applied to the $CPU_{tc}$ where the modulation characteristic alignment signals (start decode for inserted delay, gain control and spectrum control) are generated. The modulation characteristic alignment may be carried on continually, but preferably is carried on in quiet periods when paging signals are not transmitted.

It will be understood that the multiplexer 72 and the modem 70 are also used when digital page signals are generated. Since these signals are not addressed to the $CPU_{tc}$, they are transmitted as digital page audio FSK to modulate the paging transmitter.

Referring to FIGS. 9 and 9A, the phase detector 54 is illustrated. It will be appreciated that any phase detector which provides a digital output representing a phase measurement may be used. The digital detector includes three D-type flip-flops and a 16-bit binary counter. The counter is reset prior to the times of phase measurement. This reset occurs when the standard signal from the oscillator 48 clocks FF1. Since FF1 can only be reset on alternate clock cycles, an interrupt to $CPU_{tc}$ is generated on alternate cycles of the 2.875 KHz standard frequency. These alternate cycles are also shown in waveform (a) at the Q output of FF1. The $CPU_{tc}$ will reset the counter after a delay to assure that the digital word in the 16-bit counter is transferred to the $CPU_{tc}$. In other words, the counter is cleared by the $CPU_{tc}$ after each reading of the counter. On alternate cycles of the standard frequency, the gate (waveform D) is opened and the counter is enabled to count. The counter counts clock pulses at the 5 MHz rate. When the reference frequency goes high, the Q output of FF2 goes high. This causes FF4 to be set at the next clock pulse after FF2 is set when the Q output (waveform b) goes high. After one clock pulse period, the not-Q output of FF4 goes low, generating a reset pulse which resets FF3 and FF2, closing the gate. The period of the gate determines the phase measurement in terms of the count stored in the counter. As discussed above, prior to the next phase measurement, the counter is cleared by $CPU_{tc}$.

Utilizing the counts stored in the counter, the frequency error signals are generated in the $CPU_{tc}$. These digital frequency error signals are translated by the D/A 50 into signals for controlling the frequency of the standard oscillator. The frequency control signal may be adjusted to provide a programmable frequency offset for the particular carrier input (LO). When frequency offset is not used, as in other applications than paging and phase lock is required, the frequency control signal may be used to lock the phase of the standard to a certain relationship (e.g. in-phase, in-quadrature phase, etc.) with the reference.

Figure 10:
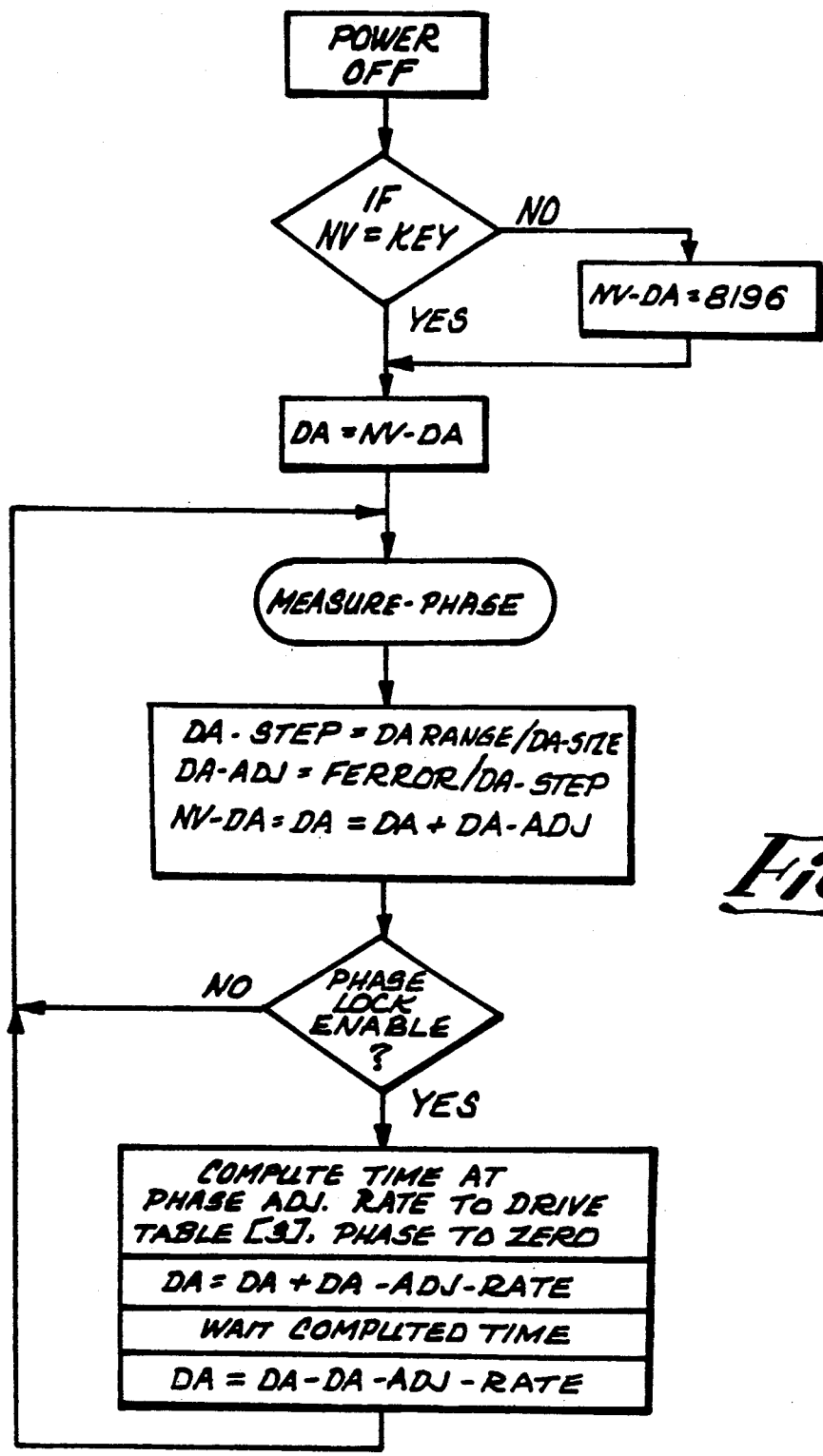

Referring first to FIG. 10, the program for the $CPU_{tc}$ which develops the frequency error (FERROR) control signals will be better understood. On power-up a non-volatile battery back-up memory in the $CPU_{tc}$ is checked by reading a key word therein. The key word is a constant defining a valid non-volatile memory. If the battery back-up is lost, the key word test will default. The non-volatile memory is scrambled and the key word test shows default when the transmitter controller is first placed into service. In the charts, "NV" means non-volatile memory protection key word. If this key word is not read out of the memory, then start-up is assumed and a word is stored in the non-volatile memory called "NV-DA" at the mid-range of the 14-bit D/A which corresponds to 8196 decimal. Thus, either the default number (8196) or the image of the last D/A setting (of the hardware D/A 50) is set into the D/A 50. In other words, the D/A is set to the center of its range or to its last setting. Next, a phase measurement process is carried out.

Phase measurement next occurs. It is a subroutine shown in FIGS. 11A and 11B which will be discussed hereinafter. It basically computes the error using the principles discussed above in the Principles of Operation section of this specification. The measure phase subroutine returns FERROR.

In the next step of the program, FERROR is used to adjust the hardware D/A 50. First, the D/A step is computed as the ratio of D/A-range, which is a constant which defines the total, adjustable range of the D/A 50 in terms of the scalar frequency control (e.g. its total frequency adjustment range which, in the illustrated case, is one part in a million, or $1.0 \times 10^{-6}$). The denominator is D/A size which is the entire D/A resolution range of 14 bits, or $2^{14}$. This indicates how much a bit of the D/A number is worth in terms of frequency change. Then, the D/A-ADJ adjustment necessary is computed which is the number of times D/A step divides into FERROR. This indicates how many steps of D/A are necessary to reduce the frequency error (i.e. the number of unit counts of D/A which must be changed). This number is set into the non-volatile memory and into the D/A as the D/A setting. With this number set, the D/A output voltage is compensating the frequency error.

If phase lock is desired, which is not used when a frequency offset is needed as in most simulcast paging systems, the following computations are made. First, the time required to drive the latest in time (current or table [3]) phase value to zero is computed. In other words, what is computed is the period of time, at a prescribed frequency error rate, to drive the phase counter to a desired relative phase defined to be the phase lock condition. Following the computed period of time, the D/A is set to a number equal to the current value of the D/A setting which is "DA". After the computed time, the D/A setting will be such that the phase of the standard frequency signal will be the same as and locked to the phase of the reference signal. Other phase relationships may be used rather than zero phase difference by inserting the number of counts corresponding to different phase relationships. After phase lock adjustment, the system returns to enable another phase measurement to be made when called for by a calibration enable signal and D/A adjustment for phase locking is repeated for each D/A adjustment as above.

This calibration enable signal may be one of the keying data words which is transmitted from the $CPU_{sc}$ to the $CPU_{tc}$ in the transmitter controllers. The time when a phase measurement is made may be a fixed time, for example every 15 minutes, or a calibration (phase measurement) may occur when the system becomes available, for example, during a quiet period when there is no paging traffic.

Figure 11A:
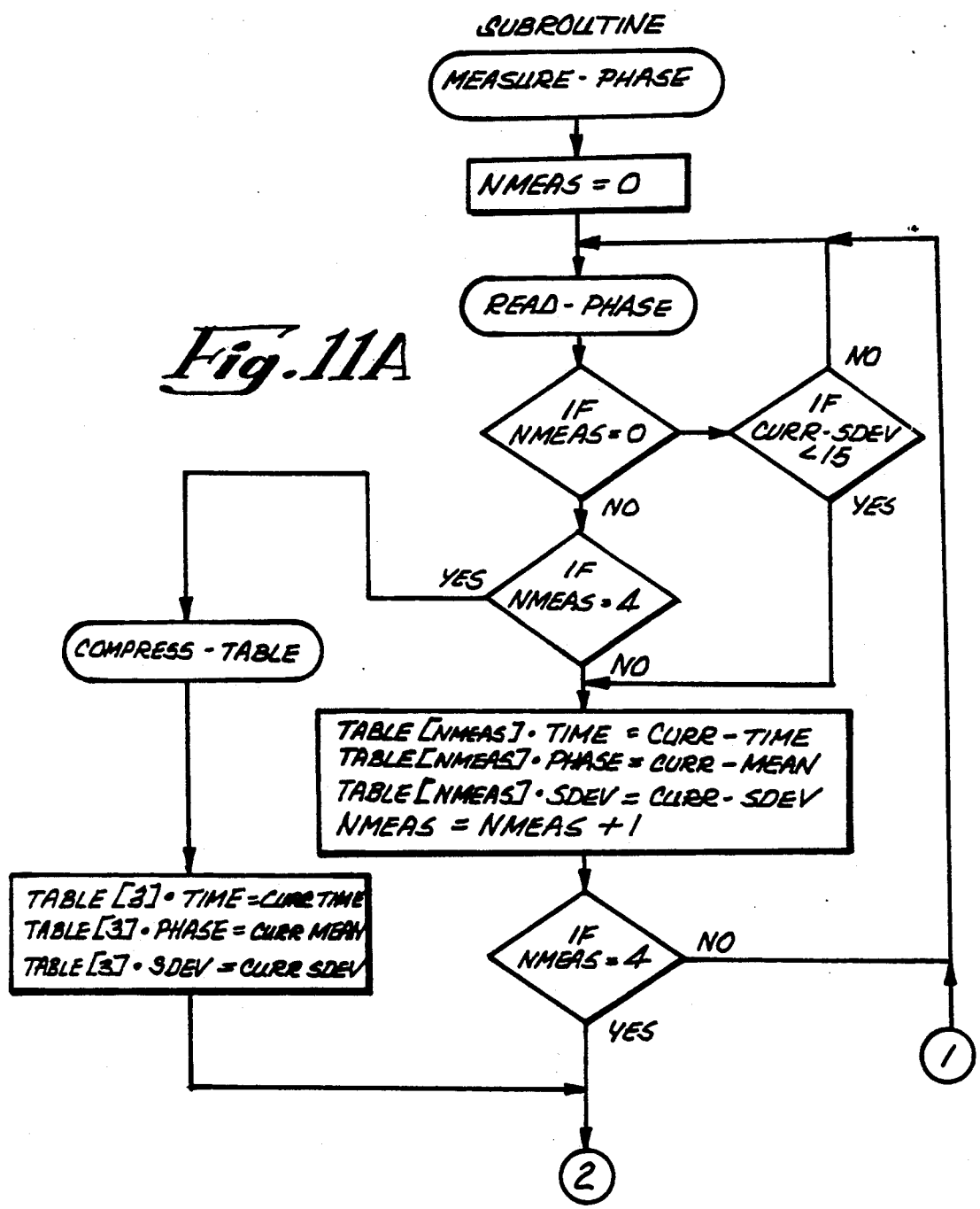
Figure 11B:
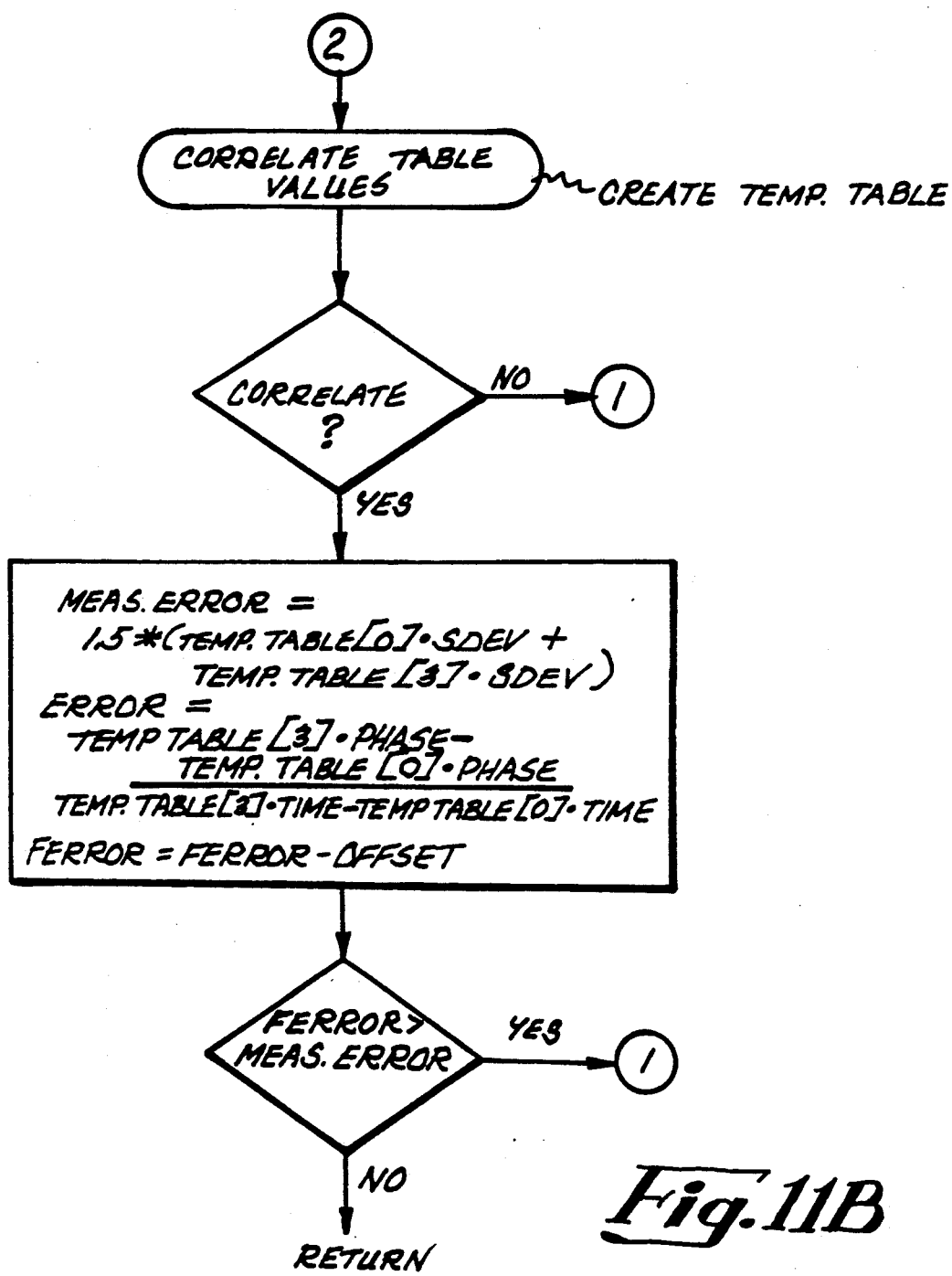

Next, consider the measure phase subroutine which is shown in FIGS. 11A and 11B. In these figures, NMEAS is the number of the measurement. Four measurements are used, an initial measurement, two intermediate measurements and a measurement at the end of the time duration, which duration is used in computing FERROR (the ratio of the difference in phase between the initial and last phase measurement to the duration of time between these measurements). NMEAS is the number of entries in a measurement table where the phase measurements are stored. When NMEAS is zero, the initial phase reading has not yet been made. When NMEAS is zero, the measurement table is empty.

Figure 12:
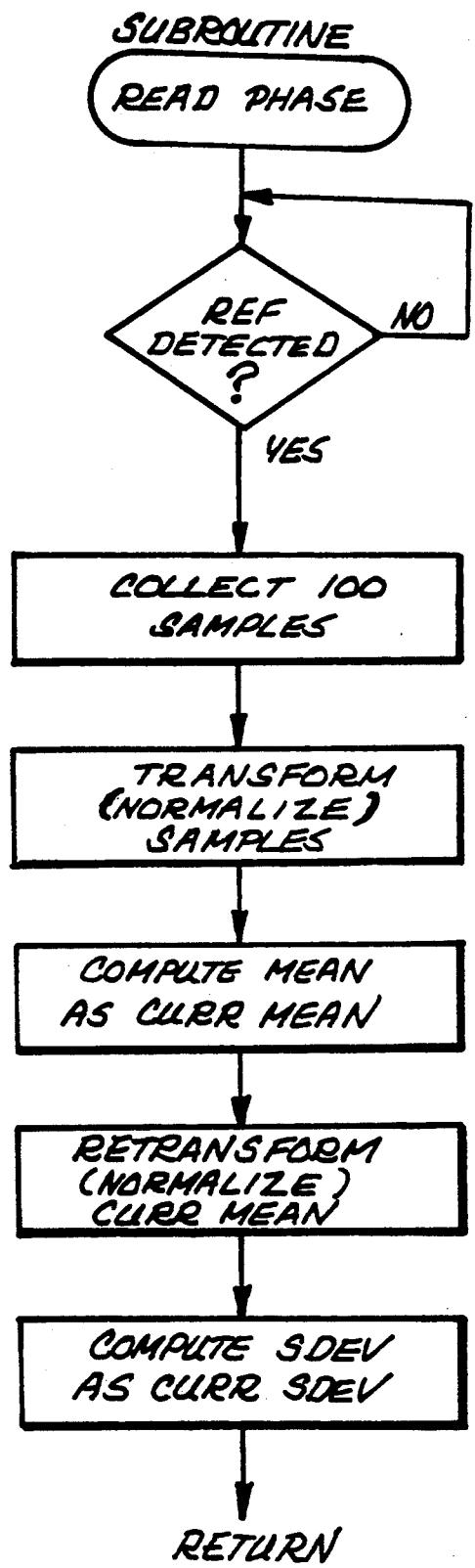

The read phase subroutine is shown in FIG. 12. First, the reference must be detected before the routine is entered. Then, 100 samples are collected at the 1.438 KHz rate. The values of these samples is transformed or normalized to accommodate values of phase which are close to the zero phase condition. This is a phase difference corresponding to approximately one cycle or 347.8 us, the period of 2.875 KHz. This is approximately 1739 counts in the 16-bit counter of the phase detector 54. This is the count that occurs at the wrap point. The transformation or normalization changes these large numbers to negative values. For example, 347.6 microseconds corresponds to a negative number (0–1); 347.4 microseconds, a still larger negative number (1–2), etc. This avoids averaging (taking the mean) of samples that are wrapping. Alternatively, the values at the wrap point may be shifted by 180°. After the transformation, the mean is computed and a value of the mean for the phase measurement is made available. Then, this value is retransformed to accommodate the transformation which is made when the values of the samples are near the wrap point. Using the current mean for this phase measurement, the standard deviation (SDEV) is computed. The conventional formula for standard deviation may be used, i.e. the standard deviation being the square root of the following: the sum of the squares of the variation from the mean of each sample divided by the square of the number of samples minus one.

On the initial reading (NMEAS equals 0), if the standard deviation as measured is greater than 15, that standard reading is disregarded and the initial reading is done at the next calibration time. For example, the samples may be taken when the reference is extremely noisy. It is then desirable to wait until a less noisy reading is made before using it as the initial reading. The initial reading is not changed during the computation of FERROR, and is therefore checked so as to be confident that it is a proper reading.

Then, the table of readings is set up, each with a set of the current time of the reading, the current mean phase value and the current standard deviation for that reading. In terms of the flowcharts, NMEAS is incremented until it equals 4, denoting that the table has four readings. After the four readings are in the table, the table values are correlated, creating another table called "Temp Table". The correlation process adjusts the values for wrap as explained above and the adjusted values of the current phase for each reading is stored in Temp Table. After correlation using the values in Temp Table, the measurement error (MEAS-ERROR) and FERROR are computed. The probability is less than 3% that any sample in the set differs from the mean by more than three standard deviations if the sum of the standard deviations for the initial and last phase measurement (Temp Table [0] and Temp Table [3]). Thus, if the frequency error as computed from the initial and last phase values and the difference in time therebetween is greater than the measurement error as computed by multiplying the sum of the standard deviations for the initial and last reading by 1.5, then the probability that the frequency error is uncertain is very low. Then, the frequency error is returned and the computation of DA-ADJ is carried out as discussed in connection with FIG. 10.

Correlation is carried out using alternating assumptions of positive and negative phase counter-wrapping (i.e. 0 wrap, 1 wrap, −1 wrap, 2 wraps, −2 wraps, etc.) until both positive and negative wrap assumptions yield an indicated frequency error in excess of the maximum frequency error or correlation is achieved. The indicated frequency error is the absolute value of the frequency error defined by the end point entries (the initial and last entry in the table) and the time duration therebetween. Correlation occurs when the intermediate phase measurements lie on the slope of the indicated frequency error plus or minus 1.5 standard deviations for their associated value on the slope. The correlation is successful or it fails.

If correlation is successful, the program continues as shown in FIG. 11B to the calculation of the measurement error and frequency error. If unsuccessful, the table is compressed and the compressed table process is carried out. The new last duration (Table [3]) is derived from reading the phase at the next correlation time. The initial phase reading is never removed. The set of second third or last readings having the shortest time difference between it and the preceeding reading is removed. The times between the first reading and the initial reading, the second reading and the first reading, and the third reading and the second reading are compared. The reading with the smallest time difference is determined and is removed. Thus, either the first, second or third reading is removed if its difference in time to the preceding reading is the smallest. The resulting table is compressed, freeing the fourth position in the table for the new reading. The correlation process is then repeated using the new value for the last reading. The system has monitors which allows only a predetermined number of iterations of the processes before an alarm condition is generated.

From the foregoing description, it will be apparent that there has been provided an improved system for frequency phase and modulation control which is especially useful in simulcast transmission systems. Other applications will be found wherever frequency and phase control is needed, particularly where reference signals are noisy or available only intermittently. The system also permits frequency offsets to be inserted as shown in FIG. 11B by changing the FERROR by an amount to provide the number of cycles (Hz) offset which is required. Variations and modifications in the herein described system, within the scope of the invention, will undoubtedly suggest themselves to those skilled in the art. Accordingly, the foregoing description should be taken as illustrative and not in a limiting sense.

We claim:

1. A system for providing a signal controlled in frequency which comprises means for providing a source of reference signal, means for providing a standard signal, the frequency of which is responsive to a frequency error signal, means for providing measurements of the relative phase difference between said reference and standard signals at a plurality of times spaced in duration from each other, means for selecting said times such that said times are spaced in duration by durations that are at least greater than the period of said standard signal, means for computing a frequency error signal in terms of the ratio of the difference in said phase measurements at at least two of said times to said duration between said two times and means for applying said frequency error signal to said standard signal providing means.

2. The system according to claim 1 further comprising means for varying said frequency error signal until said phase measurement at the end of said duration between said two times reaches a predetermined phase measurement thereby locking said standard source and reference source in phase relationship corresponding to said predetermined phase measurement.

3. The system according to claim 1 further comprising means for selecting said times such that said times are spaced in duration by durations that are at least of the order of minutes.

4. A system for providing a signal controlled in frequency which comprises means for providing a source of reference signal, means for providing a standard signal, the frequency of which is responsive to a frequency error signal, means for providing measurements of the relative phase difference between said reference and standard signals at a plurality of times spaced in duration from each other, means for translating the ratio of the difference in said phase measurements at at least two of said times to said duration between said two times into said frequency error signal, means for applying said frequency error signal to said standard signal providing means, means for making a plurality of said phase measurements over an interval occurring at each of said times, means for deriving from said plurality of measurements over said intervals the means of said phase managements during said intervals and the variances of said measurements from said means, and means for enabling said applying means when said variances are within certain bounds.

5. The system according to claim 4 including means for deriving said bounds from the standard deviations of said variances of said measurements from said mean at said times which are spaced by said duration.

6. The system according to claim 5 wherein the duration of said interval is at least equal to the period of the lowest frequency component of jitter in said phase measurements.

7. The system according to claim 6 wherein said rate is about every 2 cycles of said reference signal and said interval is from about 50 to 100 milliseconds (ms).

8. The system according to claim 4 wherein said bounds is the measurement error of said phase measurements at said times which is equal to a predetermined multiple of the sum of the standard deviations of said variances at said times which are spaced by said duration.

9. The system according to claim 4 wherein said means for making said plurality of phase measurements is operative at a rate which is a multiple of the bandwidth of said reference signal and said interval has a duration where in the integral of noise in said reference signal is non-zero.

10. A system for providing a signal controlled in frequency which comprises means for providing a source of reference signal, means for providing a standard signal, the frequency of which is responsive to a frequency error signal, means for providing measurements of the relative phase difference between said reference and standard signals at a plurality of times spaced in duration from each other, means for translating the ratio of the difference in said phase measurements at at least two of said times to said duration between said two times into said frequency error signal, means for applying said frequency error signal to said standard signal providing means, and wherein said plurality of items is at least 3, one of which is at a time intermediate said duration, and correlation determining means for determining whether the phase measurement at said intermediate time correlates with the phase measurements at the times spaced by said duration.

11. The system according to claim 10 wherein said correlation determining means comprises means responsive to the duration between the phase measurement at said intermediate time along the slope defined by said phase measurements at the time spaced by said duration and the phase measurement at said intermediate time.

12. The system according to claim 11 wherein said phase measurement providing means comprises means for making a multiplicity of said measurements during a predetermined interval at each of said times, means for deriving said phase measurements at each of said times as the mean of said multiplicity of measurements and for deriving a predetermined statistical deviation of said multiplicity of said measurements from said mean as said deviation.

13. The system according to claim 12 wherein said predetermined deviation is the standard deviation.

14. The system according to claim 11 wherein said means for determining whether said phase measurement at said intermediate time correlates, includes means for determining whether said deviation of said intermediate measurement is a predetermined multiple of said predetermined statistical deviation.

15. The system according to claim 14 wherein said phase measurement providing means further comprises means for making another phase measurement later in time than the end of said duration and extending said duration to the time of said later in time measurement when said correlation determining means determines the absence of correlation.

16. The system according to claim 15 wherein said correlation determining means includes means operative upon said another phase measurement and the one of said intermediate measurements and the one of said intermediate measurements and the measurement at the end of said duration which has the lesser time difference between it and its preceding phase measurement for determining correlation.

17. The system according to claim 16 wherein said phase measurement means includes means for providing a pair of said intermediate phase measurements which are spaced in time from each other.

18. A system for providing a signal controlled in frequency which comprises means for providing a source of reference signal, means for providing a standard signal, the frequency of which is responsive to a frequency error signal, means for providing measurements of the relative phase difference between said reference and standard signals at a plurality of times spaced in duration from each other, means for translating the ratio of the difference in said phase measurements at at least two of said times to said duration between said two times into said frequency error signal, means for applying said frequency error signal to said standard signal providing means, and means responsive to said phase measurements for adjusting said measurement at the end of said duration to accommodate one or more wraps in said measurement where said phase difference exceeds one cycle or multiples thereof.

19. The system according to claim 18 wherein said phase wrap accommodating means comprises means for making at least one phase measurement at a time intermediate said duration, correlation means for correlating said phase measurement with the phase along a line having a slope extending between an initial one of said phase measurements at the beginning of said duration and the phase measurement at the end of said duration, and means for increasing and decreasing the phase measurement at the end of said duration until correlation exists or the frequency error exceeds the adjustment range of said standard source.

20. The system according to claim 19 wherein said phase measurement means comprises means for making a multiplicity of said measurements during a predetermined interval at each of said times, means for deriving said phase measurements at each of said times as the mean of said multiplicity of measurements and for deriving a predetermined statistical deviation of said multiplicity of measurements from said mean, said correlation means including means for determining the existence of correlation when said intermediate measurement differs from the phase along said slope at the time of said intermediate measurement by a predetermined multiple of said statistical deviation.

21. The system according to claim 19 wherein said phase adjustment means also includes means for adjusting the phase of said intermediate measurement by a phase difference equal to one or more wraps in phase when it occurs at a time when said slope exceeds a phase difference greater than one cycle.

22. A system for providing a signal controlled in frequency which comprises means for providing a source of reference signal, means for providing a standard signal, the frequency of which is responsive to a frequency error signal, means for providing measurements of the relative phase difference between said reference and standard signals at a plurality of times spaced in duration from each other, means for selecting said times such that said times are spaced in duration by durations that are at least greater than the period of said standard signal, means for translating the ratio of the difference in said phase measurements at at least two of said times to said duration between said two times into said frequency error signal, means for applying said frequency error signal to said standard signal providing means, and means for changing said frequency error signal by an amount corresponding to a predetermined frequency offset thereby locking said standard signal to a frequency which differs from the frequency of said reference source by said offset.

23. The method of deriving a measurement of the frequency error between a standard signal and a reference which may be corrupted by noise and other error signals, which method comprises the steps of collecting a multiplicity of sample phase measurements of the phase difference between said reference and standard signal at a predetermined rate during an initial interval of predetermined duration and at a plurality of other intervals each occurring later in time, generating a table for each of said measurements containing its mean value, its statistical deviation and the time of its occurrence, adjusting the mean phase values in the table except for the mean phase value for the initial interval until the values lie within a predetermined multiple of their standard deviation from a line between the last and initial ones of said mean phase values which line represents an indicated frequency error thereby indicating a correlation condition, outputting said indicated frequency error as said frequency error when said indicated frequency error is less than a predetermined multiple of the sum of the standard deviations of the initial and last of said standard deviation values in said table.

24. The method according to claim 23 further comprising the step of removing said table values for the one of said measurements which is closest in time to a phase measurement which proceeds it when said correlation condition is not achieved notwithstanding adjustment of said mean phase values except for said initial mean phase value by a predetermined number of wraps (corresponding to phase differences equal to a cycle or 360° of phase difference) which exceeds the adjustment range of said standard signal, then replacing the last phase value in said table with a mean phase value for a multiplicity of phase measurements occurring at an interval later in time than the last occurring of said intervals.

25. The method according to claim 23 further comprising the step of storing values in said table as the values for said initial interval only if the standard deviation thereof is less than a predetermined standard deviation thereby excluding measurements using said reference signal when it is badly corrupted to provide values for said initial interval in said table.

26. A communication system for matching signals transmitted simultaneously by a plurality of transmitters in their modulation characteristics which comprises a station for generating said signals, said station having system controller means for generating calibration signals, a plurality of transmitter controller means each connected to a different one of said transmitters, each of said transmitter controller means having means for controlling the modulation characteristics transmitted therethrough, means for transmitting said calibration signals at different times to different ones of said transmitters, means at said station for receiving said calibration signals from said transmitters, said system controller having means for correlating said calibration signals received from said transmitters with each other and for transmitting digital control signals to each of said transmitters representing differences in said modulation characteristics therebetween, and means in said transmitter controller means responsive to said digital control signals for operating said modulation characteristic controlling means to match said modulation characteristics of said transmitters.

27. The system according to claim 26 wherein said modulation characteristics are selected from the group consisting of delay, gain and spectral content, and said modulation characteristic control means includes circuit means in the path of signals for modulating said transmitters selected from the group consisting of delay insertion means, gain control means and filter means.

28. The system according to claim 26 wherein said transmitters are controlled in carrier frequency of the signals which are modulated therein, said system controller means including means for transmitting a reference signal at a frequency in the voice band to said transmitters, and means in said transmitter controller including a carrier frequency source responsive intermittently to said control signals for deriving measurements of the frequency error between said reference signal and a signal coherent with said carrier frequency for controlling the frequency of said carrier frequency source.

29. A system for providing a signal controlled in frequency which comprises means for providing a source of reference signal, means for providing a standard signal, the frequency of which is responsive to a frequency error signal, means for providing measurements of the relative phase difference between said reference and standard signals at a plurality of times spaced in duration from each other, means for selecting said times such that said times are spaced in duration by durations that are at least greater than the period of said standard signal, means for translating the ratio of the difference in said phase measurements at at least two of said times to said duration between said two times into said frequency error signal, means for applying said frequency error signal to said standard signal providing means, and means for selecting said times so that a plurality of said durations are unequal from each other and are not integral multiples.

30. A system for providing a signal controlled in frequency which comprises means for providing a source of reference signal, means for providing a standard signal, the frequency of which is responsive to a frequency error signal, means for providing measurements of the relative phase difference between said reference and standard signals at a plurality of times spaced in duration from each other, means for selecting said times such that said times are spaced in duration by durations that are at least greater than the period of said standard signal, means for translating the ratio of the difference in said phase measurements at at least two of said times to said duration between said two times into said frequency error signal, means for applying said frequency error signal to said standard signal providing means, and said means for providing a source of reference signal including means operative to provide said reference signal intermittently at times spaced in duration from each other corresponding to the times when said measurements are made.

31. In a communications system wherein information signals are transmitted over a certain bandwidth from a station for retransmission by transmitters remote from said station and each of which has an oscillator, a control system for controlling said oscillators of said transmitters which comprises means for transmitting reference signals in said bandwidth from said station to said transmitters at a plurality of times the interval between which is varied, means for selecting said times such that said times are spaced in duration by durations that are at least greater than the period of said reference signal, transmitter controlling means in each of said transmitters having means for providing measurements of the phase differences between said reference signals and signals from the oscillator thereof at each of said times, means for providing outputs corresponding to the slope of said phase measurements to provide frequency error signals, and means for providing said error signals to said oscillator.

32. The control system according to claim 31 further comprising means for making a plurality of said phase measurements over an interval occurring at each of said times, means for deriving from said plurality of measurements over said intervals, the means of said measurements during said intervals and the variances of said measurements from said means, and means for enabling said applying means when said variances are within certain bounds.

33. The system according to claim 32 wherein said variances are represented by the standard deviation of said measurements.

34. The control system according to claim 31 further comprising means responsive to the duration between successive ones of said phase measurements for determining the correlation therebetween.

35. In a communication system having a plurality of transmitters for transmitting signals simultaneously, said system having a station for generating said signals and also for generating control signals, apparatus for controlling the modulation characteristics of said signals, which said transmitters are transmitting comprising transmitter controllers in each of said transmitters, means for operating said transmitter controllers with said control signals, CODECS in said transmitter controllers for applying said signals which said transmitters are transmitting to said transmitters, said CODECS having means for converting said signals into PCM signals and back from PCM signals into said signals which said transmitters are transmitting, and means in said transmitter controllers for addressing said CODECS to interpose selective delay on said signals being applied to said transmitters.

36. The apparatus according to claim 35 wherein said addressing means is a CPU, and means for inputting data corresponding to said control signals to said CPU.

* * * * *